(12) United States Patent
Kweon et al.

(10) Patent No.: US 6,818,935 B2
(45) Date of Patent: Nov. 16, 2004

(54) SEMICONDUCTOR DEVICE AND METHOD FOR FABRICATING THE SAME

(75) Inventors: Soon-Yong Kweon, Ichon-shi (KR); Seung-Jin Yeom, Ichon-shi (KR); Eun-Seok Choi, Ichon-shi (KR); Jin-Yong Seong, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/238,710

(22) Filed: Sep. 11, 2002

(65) Prior Publication Data

US 2003/0057445 A1 Mar. 27, 2003

(30) Foreign Application Priority Data

| Sep. 12, 2001 | (KR) | 2001-56143 |
| Sep. 17, 2001 | (KR) | 2001-57368 |

(51) Int. Cl.[7] .................................................. H01L 31/062
(52) U.S. Cl. ........................................ 257/295; 257/296
(58) Field of Search .................................. 257/295, 296, 257/304

(56) References Cited

U.S. PATENT DOCUMENTS

| 5,382,817 | A | * | 1/1995 | Kashihara et al. ........... 257/295 |
| 5,691,235 | A | | 11/1997 | Meikle et al. |
| 5,960,295 | A | | 9/1999 | Jen et al. |
| 6,171,899 | B1 | | 1/2001 | Liou et al. |
| 6,190,963 | B1 | | 2/2001 | Zhang et al. |
| 6,194,228 | B1 | | 2/2001 | Fujiki et al. |
| 6,238,934 | B1 | | 5/2001 | Yang |
| 6,245,650 | B1 | | 6/2001 | Watanabe |
| 6,461,913 | B2 | * | 10/2002 | Hong .......................... 438/253 |
| 6,498,094 | B2 | * | 12/2002 | Nakao et al. ............... 438/650 |
| 6,537,875 | B2 | * | 3/2003 | Won et al. .................. 438/254 |

FOREIGN PATENT DOCUMENTS

| JP | 2000-36443 A | 2/2000 |
| JP | 2000-91539 A | 3/2000 |
| JP | 2001-44073 A | 2/2001 |
| JP | 2001-053249 | 2/2001 |
| KR | 1999-5449 | 1/1999 |

* cited by examiner

Primary Examiner—Hoai Ho
Assistant Examiner—Tu-Tu Ho
(74) Attorney, Agent, or Firm—Birch, Stewart, Kolasch & Birch, LLP

(57) ABSTRACT

A semiconductor device, capable of precluding the deterioration of flatness and electrical properties due to the non-planarized topology and enhancing oxidative endurance and the process margins, which includes a conductive layer, an insulated layer formed on the conductive layer, a glue layer formed on the insulating layer, a connection unit, which is in contact with the conductive layer through the glue layer and the insulating layer and whose surface is planarized with that of the glue layer and a capacitor including a first electrode formed on the connection unit and the glue layer, a dielectric layer formed on the first electrode and a second electrode formed on the dielectric layer.

24 Claims, 12 Drawing Sheets

SEMICONDUCTOR DEVICE AND METHOD FOR FABRICATING THE SAME

BACKGROUND OF THE INVENTION

1. Field of the Invention

The present invention relates to semiconductor devices; and, more particularly, to a semiconductor device employing a dielectric layer and a method for fabricating the same.

2. Description of Related Art

In general, as the trend of semiconductor devices goes to high integration, miniaturization and high-speed operation, the area assigned to the capacitor is also being reduced. However, despite of the trend of the semiconductor device, the capacitor should attain a minimum capacitance capable of driving the semiconductor device.

As one solution of securing the minimum capacitance, the bottom electrode of the capacitor is fabricated in various structural configurations, such as a cylinder, a stack, a pin and including concave structures, thereby maximizing the effective surface area of the bottom electrode of the capacitor in a limited and reduced area.

As another solution of securing the minimum capacitance, there is provided as the dielectric layer of the capacitor, dielectric layers having a high dielectric constant such as BST and $Ta_2O_5$, and ferroelectrics layers such as $SBTN((Sr, Bi)(Ta, Nb)_2O_9)$, $SBT((Sr, Bi)Ta_2O_9)$ and $BLT((Bi, La)Ti_3O_{12})$. In case of employing a dielectric layer having a high dielectric constant and a ferroelectrics layer, with respect to electric properties, the top and the bottom electrode of the capacitor are formed by using metals such as Pt, Ir, Ru, IrO, RuO, Pt-alloy, TiN and so on.

In particular, when forming the bottom electrode of the capacitor by using the above metals, there is employed a poly-Si plug (PP) structure in which a storage node contact plug is formed on a semiconductor substrate for providing the connection with a transistor, which includes a word line and a bit line and was already fabricated on the semiconductor substrate, and then, the bottom electrode is connected to the storage node contact plug.

Referring to FIGS. 1A and 1B, there are shown cross-sectional views showing process steps of a conventional method for fabricating a semiconductor device.

As illustrated in FIG. 1A, a gate oxide film 12 and a word line 13 are formed on a semiconductor substrate 11.

Then, a source electrode 14a and a drain electrode 14b are formed at both sides of the word line 13 by implanting impurity ions into the substrate 11. A first interlayer insulating layer 15 is made on the overall surface of an intermediate product including the substrate 11.

After forming a first contact hole exposing the surface of the drain electrode 14b (or the source electrode 14a) by selectively etching the first interlayer insulating layer 15, tungsten is deposited on the surface of the first interlayer insulating layer 15 and the first contact hole.

Subsequently, there is made a bit line contact (BLC), i.e., a tungsten plug 16, which is filled in the first contact hole through the use of an etch-back or a chemical mechanical polishing (CMP) method.

Next, a bit line 17 is formed connected to the drain electrode 14b through the tungsten plug 16 by depositing a conductive layer for the bit line on the first interlayer insulating layer 15 and the tungsten plug 16 and selectively patterning the deposited conductive layer.

A second interlayer insulating layer 18 is deposited on the overall surface of the intermediate product including the bit line 17 and planarized. Next, a second contact hole is formed by exposing the surface of the source 14a (or drain electrode 14b) by sequentially etching the second and the first interlayer insulating layers 18 and 15 through the use of a patternized photoresist film as a mask (not shown). The second contact hole is generally called a storage node contact hole.

Then, a poly-Si plug 19 is formed and recessed in the inside of the second contact hole by depositing poly-Si on the second interlayer insulating layer 18 and the second contact hole and performing an etch-back or a CMP for the deposited poly-Si.

A titanium(Ti)-silicide layer 20 is formed on the poly-Si plug 19 by depositing titanium on the second interlayer insulating layer 18 and the poly-Si plug 19 and then performing a rapid thermal process (RTP) on the deposited titanium to thereby cause a reaction between silicon (Si) atoms and the titanium.

The Ti-silicide layer 20 makes ohmic contact between the poly-Si plug 19 and a bottom electrode of a capacitor to be formed later.

After removing unreacted titanium, a titanium-nitride (TiN) layer 21 fills up the remaining portion of the second contact hole by depositing TiN on the second interlayer insulating layer 18 and the Ti-silicide layer 20 and etching the deposited TiN through the use of CMP or etch-back until the surface of the second interlayer insulating layer 18 is exposed.

The TiN layer 21 is used as a barrier metal precluding the inter-diffusion between the poly-Si plug 19 and the bottom electrode.

Next, a glue layer 22 is applied to the second interlayer insulating layer 18 and the TiN layer 21 and then selectively etched to form a third contact hole exposing the surface of the TiN layer 21.

Herein, since the glue layer 22 is nonconductive, the third contact hole is made to electrically connect the bottom electrode including a diffusion barrier layer with the TiN layer 21 and the width of the third contact hole can be wider than that of the second contact hole.

The glue layer 22 is formed for increasing the adhesive force between the bottom electrode and the second interlayer insulating layer 18 and employs $IrO_2$.

As shown in FIG. 1B, a capacitor structure is constructed by sequentially forming a diffusion barrier layer 23, a bottom electrode 24, a dielectric layer 25 and a top electrode 26 on the surface of the glue layer 22 and the third contact hole and by first patterning the top electrode 26 and then the rest of layers, i.e., the dielectric layer 25, the bottom electrode 24 and the diffusion barrier layer 23, and the glue layer 22.

In the conventional capacitor over bit line (COB) structure described above, the process of forming the storage node contact (SNC) consisting of the silicon plug, the Ti-silicide layer and the TiN layer is very important.

The storage node contact should have thermal endurance for a high temperature thermal treatment necessary for the crystallization of the dielectric layer in constructing the capacitor.

When forming the dielectric layer through the use of a metal organic deposition (MOD) method or a Sol-gel method, the underlying layers of the capacitor should have an excellent flatness and it is necessary to form the glue layer positioned between the diffusion barrier layer and the plug. The thinner the glue layer, the better. The reason is that the non-planarized topology, caused in forming the third contact hole made in the nonconductive glue layer so as to connect the diffusion barrier layer and the TiN layer, has a bad effect on the deposition of a following ferroelectric layer.

When forming the contact hole of the glue layer connecting the diffusion barrier layer and the TiN layer, the influence of the non-planarized topology in depositing the dielectric layer should be removed by attaining a high etch selectivity between the interlayer insulating layer and the TiN layer and between the interlayer insulating layer and the glue layer.

In the conventional fabricating method shown in FIGS. 1A and 1B, since the glue layer positioned between the diffusion barrier layer ($IrO_x/Ir$) and the barrier metal layer (TiN/TiSi) is made of $IrO_2$, the glue layer can obtain its essential adhesive property. However, since $IrO_2$ is not a reactive material, the etching of $IrO_2$ is performed through the use of a physical etching method. As a result, a trench "A" may be generated as shown in FIG. 2 because the etch selectivity between the interlayer insulating layer and the barrier metal layer is low in the over-etching required for forming the contact hole in the glue layer.

The over-etching makes the non-planarized topology when depositing the dielectric layer constructing the capacitor and. Thus, it is impossible to form a dielectric layer having a uniform thickness, so that there may occur a crack in the dielectric layer in a subsequent thermal treatment. Although a crack may not occur, it is still difficult patterning a capacitor having a non-uniform thickness.

Further, by the non-planarized topology, contact errors can be caused in the storage node contact in the subsequent thermal treatment necessary for the dielectric layer and it is difficult to implement a uniform and reliable semiconductor device since there is a difficulty in controlling the charge flowing from the dielectric layer due to the reduction of the practical contact area between the dielectric layer and the bottom electrode.

The above defects can be caused in capacitors of all semiconductor devices employing a dielectric layer requiring thermal treatment as well as the ferroelectric layer.

SUMMARY OF THE INVENTION

It is, therefore, a primary object of the present invention to provide a semiconductor device capable of precluding the deterioration of flatness and electrical properties due to the non-planarized topology and enhancing the oxidative endurance and a process margin. The present invention is also concerned with a method for fabricating the semiconductor device.

In accordance with the present invention, there is provided a semiconductor device comprising: a conductive layer; an insulating layer formed on the conductive layer; a glue layer formed on the insulating layer; a connection unit, which is in contact with the conductive layer through the glue layer and the insulating layer and whose surface is planarized with that of the glue layer; and a capacitor including a first electrode formed on the connection unit and the glue layer, a dielectric layer formed on the first electrode and a second electrode formed on the dielectric layer.

To produce the inventive semiconductor device, in accordance with one embodiment of the present invention, there is provided a method for fabricating a semiconductor device, comprising the steps of: forming an insulating layer on a first conductive layer; forming a first connection layer which is in contact with the first conductive layer through the insulating layer; forming a glue layer on the insulating layer and the first connection layer; forming an opening which exposes the first connection layer by removing a part of the glue layer; forming a second connection layer, which fills the opening and whose surface is planarized with that of the glue layer; and forming a capacitor including a first electrode formed on the second connection layer and the glue layer, a dielectric layer and a second electrode.

In accordance with another embodiment of the present invention, there is provided a method for fabricating a semiconductor device, comprising the steps of: forming an interlayer insulating layer on a semiconductor substrate where a transistor is formed; forming a contact hole exposing a certain part of the semiconductor substrate by selectively etching the interlayer insulating layer; forming a plug containing silicon, which remains on the interlayer insulating layer in a predetermined thickness and fills up the contact hole; forming a glue layer containing silicon and iridium on the plug and the interlayer insulating layer; forming an opening to expose the plug by selectively etching the glue layer; forming a barrier layer on the glue layer and the opening; planarizing the barrier layer until the surface of the glue layer is exposed; and forming a capacitor including a bottom electrode, a dielectric layer and a top electrode on the barrier layer and the glue layer.

In accordance with still another embodiment of the present invention, there is provided a method for fabricating a semiconductor device, comprising the steps of: stacking an insulating layer and a glue layer on a conductive layer; forming a contact hole exposing a certain surface of the conductive layer by selectively etching the glue layer and the insulating layer; forming a connection unit whose surface is planarized with that of the glue layer by filling up the inside of the contact hole; and forming a capacitor on the connection unit.

BRIEF DESCRIPTION OF THE DRAWINGS

The above and other objects and features of the present invention will become apparent from the following description of the preferred embodiments taken in conjunction with the accompanying drawings, wherein.

DETAILED DESCRIPTION OF THE INVENTION

Hereinafter, some preferred embodiments of the present invention would be described in detail with reference to the accompanying drawings.

In accordance with the present invention, there is provided a semiconductor device capable of enhancing oxidative endurance of a connection unit (plug/ohmic contact layer/barrier layer) as well as suppressing the generation of non-planarized topology caused by employing a glue layer, and methods for fabricating the semiconductor device.

Figure 1A:
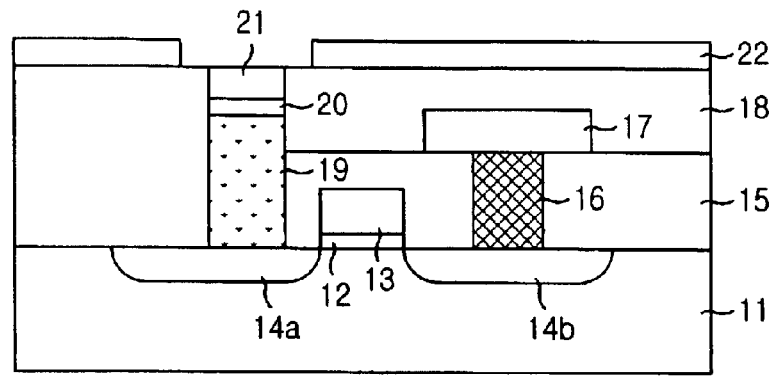
FIGS. 1A and 1B are cross-sectional views showing a conventional method for fabricating a semiconductor device.
Figure 1B:
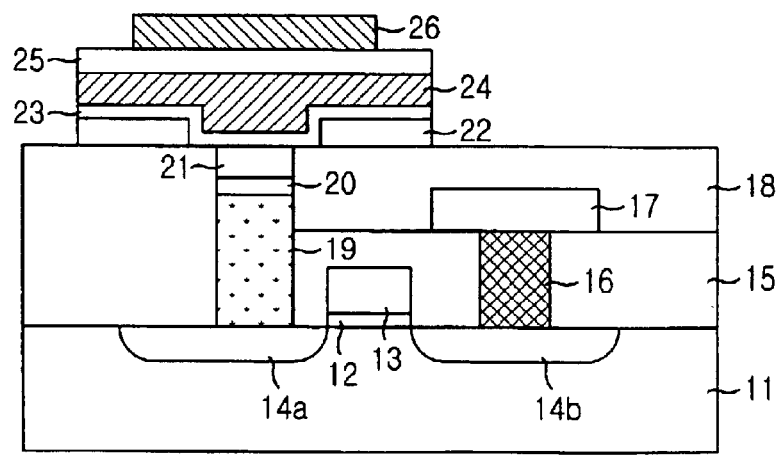
Figure 2:
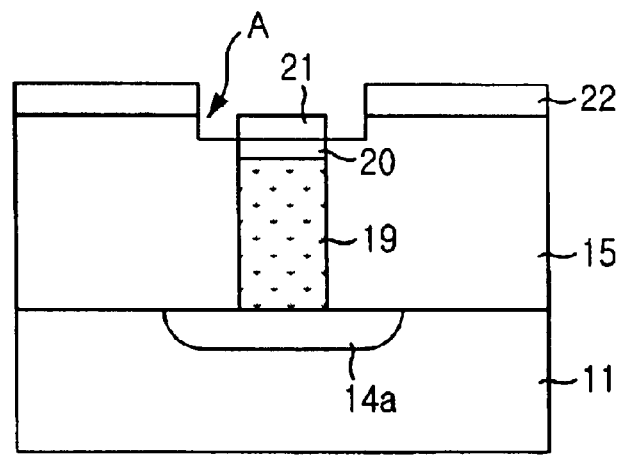
FIG. 2 is a view showing the problem of the conventional fabricating method.
Figure 3:
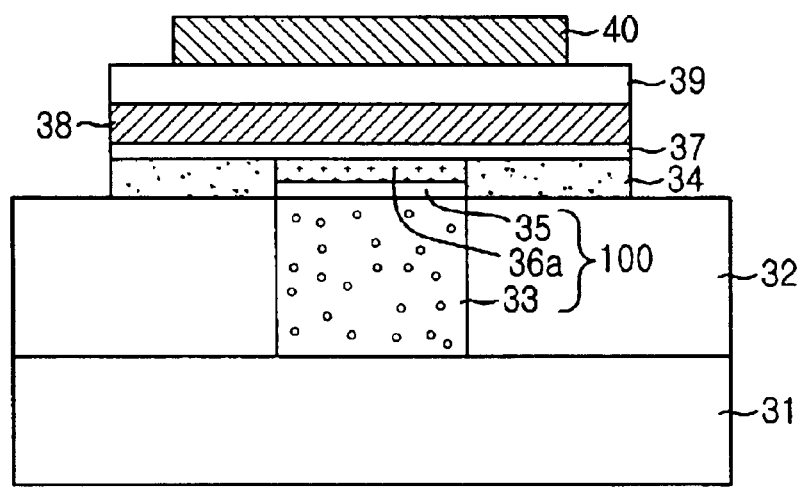
FIG. 3 is a cross-sectional view of a semiconductor device in accordance with a first embodiment of the present invention.

Referring to FIG. 3, there is shown a cross-sectional view of a semiconductor device in accordance with a first embodiment of the present invention. For the simplicity of illustration, the drawing illustrates only a capacitor formed on a semiconductor substrate.

In FIG. 3, the semiconductor device includes an interlayer insulating layer 32 formed on the semiconductor substrate 31, a glue layer 34 formed on the interlayer insulating layer 32, a connection unit 100 having the laminated structure of a plug 33, an ohmic contact layer 35 and a barrier layer 36a, which is formed to be in contact with the substrate 31 through the glue layer 34 and the interlayer insulating layer 32 and whose surface is planarized with that of the glue layer 34. The capacitor has a bottom electrode 38 including a diffusion barrier layer 37 formed on the connection unit 100 and the glue layer 34, a dielectric layer 39 disposed on the bottom electrode 38 and a top electrode 40 formed on the dielectric layer 39.

Herein, the glue layer 34 is a metal layer containing iridium and silicon, e.g., $IrSi_x$. The connection unit 100 employs, for example, a poly-Si plug as the plug 33, a Ti-silicide layer as the ohmic contact layer 35 and a TiN layer as the barrier layer 36a. The surface of the TiN layer 36a is planarized with that of the glue layer 34.

Meanwhile, a conductive layer for the plug 33 of the connection unit 100 is made of one member selected from the group consisting of poly-Si, tungsten (W), W-silicide, TiN, TiAlN, TaSiN, TiSiN, TaN, TaAlN, TiSi, TaSi and combination thereof.

The barrier layer 36a of the connection unit 100 is formed by one member selected from the group consisting of TiN, TaN, TiSiN, TiAlN, RuTiN and RuTiO and is conductive so as to connect the poly-Si plug 33 with the bottom electrode 38.

The ohmic contact layer 35 of the connection unit 100 is made of one member selected from Ti-silicide, CoSi and MoSi.

The interlayer insulating layer 32 is made of one member selected from the group consisting of boron silicate glass (BSG), boron phosphor silicate glass (BPSG), a high density plasma (HDP) oxide layer, undoped silicate glass (USG), tetra ethyl ortho silicate (TEOS), advanced planarization layer (APL) oxide layer, spin on glass (SOG) and mixtures thereof.

The diffusion barrier layer 37 for suppressing oxide diffusion, the bottom electrode 38 and the top electrode 40 are formed by one member selected from the group consisting of Pt, Ir, $IrO_x$, Ru, $RuO_x$, Rh, $RhO_x$, Os, $OsO_x$(x=1~2), Pd, $PdO_x$(x=1~2), $CaRuO_3$, $SrRuO_3$, $BaRuO_3$, $BaSrRuO_3$, $CaIrO_3$, $SrIrO_3$, $BaIrO_3$, (La, Sr)$CoO_3$, Cu, Al, Ta, Mo, W, Au, Ag, $WSi_2$, $TiSi_2$, $MoSi_x$(x=0.3~2), $CoSi_x$ (x=1~2), $NbSi_x$(x=0.3~2), $TaSi_x$(x=1~2), TiN, TaN, WN, TiSiN, TiAlN, TiBN, ZrSiN, ZrAlN, MoSiN, MoAlN, RuTiN, IrTiN, TaSiN, TaAlN and mixtures thereof.

The dielectric layer 39 is made of a ferroelectric layer or a layer having a high dielectric constant, which can include $Ta_2O_5$, STO($SrTiO_3$), BST, PZT, PLZT((Pb, La)(Zr, Ti)$O_3$), BTO($BaTiO_3$), PMN(Pb($Ng_{1/3}Nb_{2/3})O_3$), SBTN((Sr, Bi)(Ta, Nb)$_2O_9$), SBT((Sr, Bi)$Ta_2O_9$), BLT((Bi, La)$Ti_3O_{12}$) and PT($PbTiO_3$).

Referring to FIGS. 4A to 4E, there are illustrated cross-sectional views showing process steps of a method for fabricating the semiconductor device in accordance with the first embodiment of the present invention.

Figure 4A:
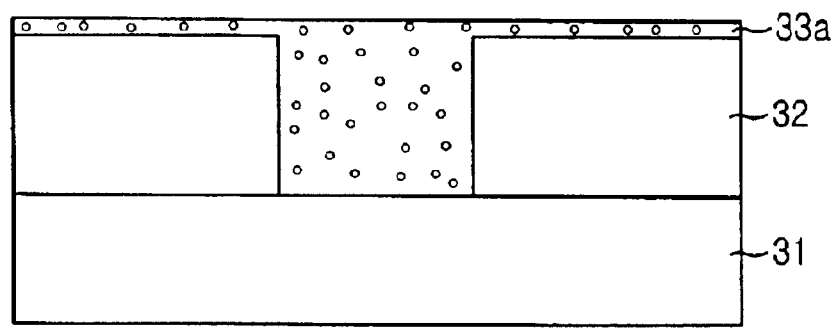
FIGS. 4A to 4E are cross-sectional views showing process steps utilized in the method for fabricating the semiconductor device in accordance with the first embodiment of the present invention.

As shown in FIG. 4A, the interlayer insulating layer 32 is deposited and planarized on the semiconductor substrate 31 on which a bit line contact, a bit line and a transistor consisting of a word line, and a source and a drain are formed.

Then, after forming a contact hole exposing a certain surface of the semiconductor substrate 31 (the source or drain) by selectively etching the interlayer insulating layer 32, poly-Si 33a is deposited on the interlayer insulating layer 32 in which the contact hole is formed. The poly-Si 33a is deposited by using any one of a chemical vapor deposition (CVD), a physical vapor deposition (PVD) or an atomic layer deposition (ALD) method.

The poly-Si 33a is recessed to remain on the interlayer insulating layer 32 outside the contact hole with a thickness of 10 Å to 1000 Å.

Figure 4B:
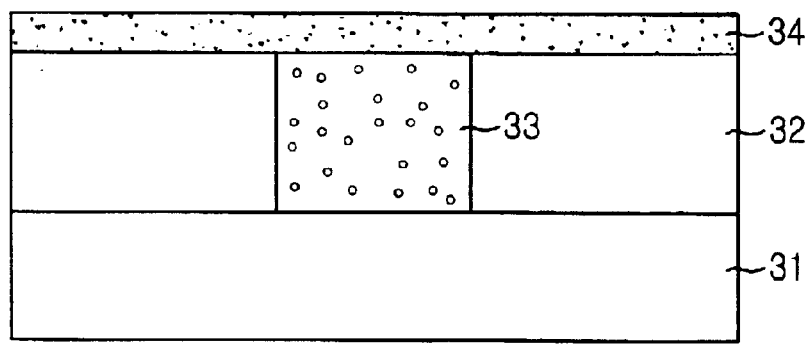

In FIG. 4B, the iridium-silicide ($IrSi_x$) layer 34 is formed by a silicide reaction of iridium with the silicon atoms of the poly-Si layer 33a by depositing iridium on the poly-Si layer 33a in a high temperature in-situ environment.

At this time, since the poly-Si outside the contact hole is all consumed when forming the iridium-silicide layer 34, the poly-Si does not exist on the interlayer insulating layer 32 and the poly-Si inside the contact hole acts as a plug 33 (hereinafter, referred to as 'poly-Si plug').

In case of using the $SiO_2$ series interlayer insulating layer 32, and the diffusion barrier layer 37 and the bottom electrode 38 containing iridium, the iridium-silicide layer 34 has an excellent adhesive force since it contains therein silicon and iridium.

The iridium-silicide layer 34 is formed by depositing iridium at a temperature of 500° C. to 800° C. by an in-situ process and, then, performing at least one thermal treatment of the deposited iridium at a temperature of 500° C. to 800° C. At this time, a composition ratio of iridium to silicon is determined according to the temperature and environment of the thermal treatment, and the electrical conductivity varies depending on the composition ratio.

Figure 4C:
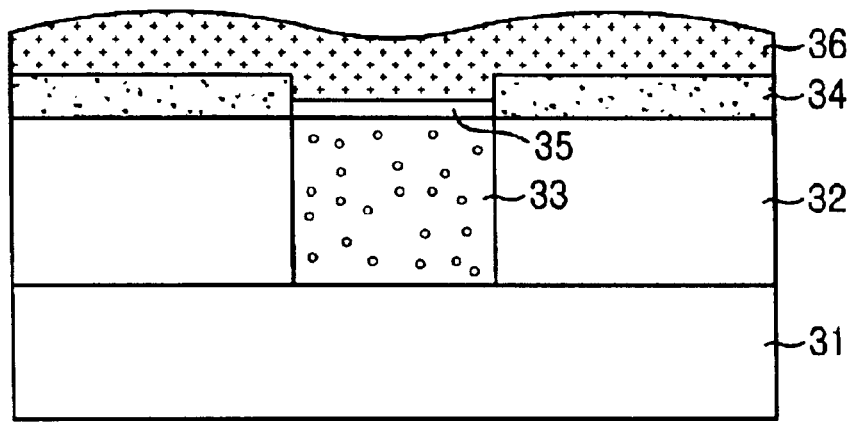

As illustrated in FIG. 4C, there is formed a contact hole for connecting the poly-Si plug 33 with the bottom electrode 38 to be formed later by selectively etching the iridium-silicide layer 34.

Subsequently, the Ti-silicide layer 35 is formed on the poly-Si plug 33 by a reaction of Ti with the silicon atoms of the poly-Si plug 33 whereby Ti is deposited on the surface of the intermediate product and a RTP is performed for the deposited Ti.

Herein, the Ti-silicide layer 35 forms an ohmic contact between the poly-Si plug 33 and the bottom electrode 38.

Next, after removing unreacted Ti, TiN 36 is deposited on the surface of the intermediate product.

Figure 4D:
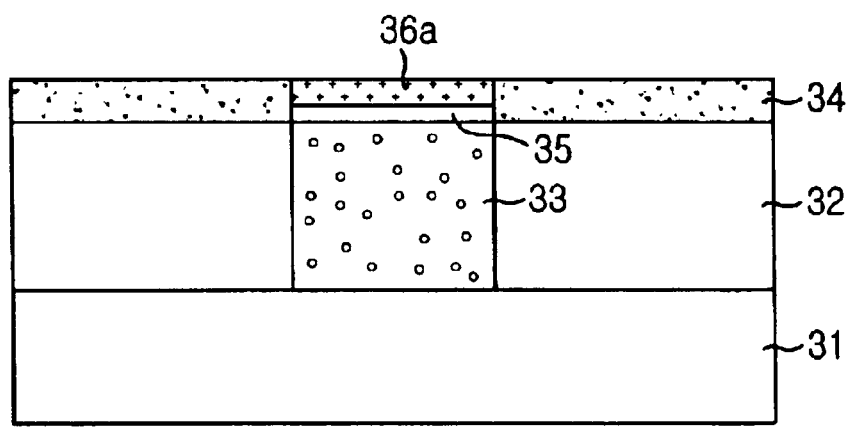

In FIG. 4D, the TiN layer 36a is formed by performing the CMP process for the TiN 36 until the surface of the glue layer 34 is exposed, wherein the TiN layer 36a has a planarized structure which entirely fills up the contact hole.

At this time, it is possible to minimize the loss of the glue layer 34 in the CMP process by appropriately adjusting the amount of slurry so as to maintain a polishing ratio of the TiN 36 to the glue layer 34 at 50~80:1.

It is preferable that the barrier layer, such as the TiN layer 36a, has a thickness of 50 Å to 5000 Å to reduce the contact resistance and to enhance its diffusion barrier property. Its oxidation barrier property can be improved by further executing a plasma process using $N_2$, $N_2O$, $NH_3$ or $O_2$.

Figure 4E:
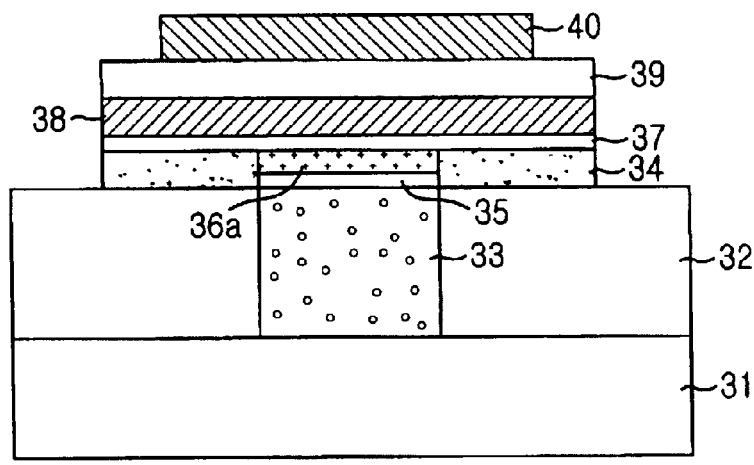

In FIG. 4E, after forming the diffusion barrier layer 37 on the TiN layer 36a and the glue layer 34, there are sequentially formed on the diffusion barrier layer 37, the bottom electrode 38, the dielectric layer 39 and the top electrode 40.

The dielectric layer 39 is deposited through the use of one of the MOD, the Sol-gel, the spin-on, the CVD, the ALD and the PVD methods. The diffusion barrier layer 37, the bottom electrode 38 and the top electrode 40 are deposited by one of the MOD, the CVD, the ALD and the PVD methods.

Next, the capacitor is made by patterning the top electrode 40 and then sequentially patterning the dielectric layer 39, the bottom electrode 38, the diffusion barrier layer 37 and the glue layer 34, wherein the width of the bottom electrode 38 is wider than that of the top electrode 40.

After patterning the dielectric layer 39, at least one thermal treatment is performed at 300° C. to 850° C. for the intermediate product. After forming the capacitor, a plasma process is conducted for the resulting product in a gas atmosphere containing $N_2$, e.g., $NH_3$, for improving the properties of the capacitor.

For example, after solving the oxygen deficiency in the layers by performing an $UV-O_3$ thermal treatment or the plasma thermal treatment at a low temperature of 300° C. to 500° C., the RTP or furnace annealing is performed at a temperature of 500° C. to 850° C. to remove impurities such as carbon, hydrogen, etc. remaining in the layers and obtain a dielectric property.

Figure 5:
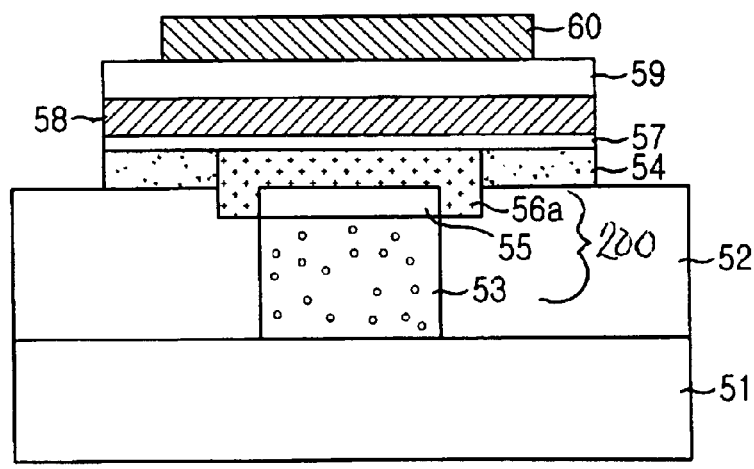
FIG. 5 is a cross-sectional view of a semiconductor device in accordance with a second embodiment of the present invention.

Referring to FIG. 5, there is shown a cross-sectional view of a semiconductor device in accordance with a second embodiment of the present invention, wherein the capacitor is connected to a semiconductor substrate.

The semiconductor device includes an interlayer insulating layer 52 formed on the semiconductor substrate 51, a glue layer 54 formed on the interlayer insulating layer 52, a connection unit 200 having the laminated structure of a plug 53, an ohmic contact layer 55 and a barrier layer 56a. The connection unit 200 is connected to the semiconductor substrate 51 through the glue layer 54 and the interlayer insulating layer 52 and its surface is planarized with that of the glue layer 54. The capacitor has a bottom electrode 58 employing a diffusion barrier layer 57 formed on the connection unit 200 and the glue layer 54, a dielectric layer 59 formed on the bottom electrode 58 and a top electrode 60 formed on the dielectric layer 59.

The glue layer 54 is a metal layer containing iridium and silicon, e.g., $IrSi_x$. For example, the connection unit 200 employs a poly-Si plug as the plug 53, a Ti-silicide layer as the ohmic contact layer 55 and a TiN layer as the barrier layer 56a, wherein the width of the TiN layer 56a is larger than that of the poly-Si plug 53. That is, an upper portion of the connection unit 200 is wider than its lower portion.

In the meantime, a conductive layer for the plug 53 constructing the connection unit 200 is made of one member selected from the group consisting of poly-Si, W, W-silicide, TiN, TiAlN, TaSiN, TiSiN, TaN, TaAlN, TiSi, TaSi and mixtures thereof.

The barrier layer 56a of the connection unit 200 is formed by one member selected from the group consisting of TiN, TaN, TiSiN, TiAlN, RuTiN and RuTiO, and is conductive to connect the poly-Si plug 53 with the bottom electrode 58.

The ohmic contact layer 55 of the connection unit 200 is made of one of Ti-silicide, CoSi and MoSi.

The interlayer insulating layer 52 is made of one member selected from a group consisting of BSG, BPSG, HDP oxide layer, USG, TEOS, APL oxide layer, SOG and mixtures thereof.

The diffusion barrier layer 57, suppressing oxide diffusion, the bottom electrode 58 and the top electrode 60 are formed by at least one member selected from the group consisting of Pt, Ir, $IrO_x$, Ru, $RuO_x$, Rh, $RhO_x$, Os, $OsO_x$ (x=1~2), Pd, $PdO_x$(x=1~2), $CaRuO_3$, $SrRuO_3$, $BaRuO_3$, $BaSrRuO_3$, $CaIrO_3$, $SrIrO_3$, $BaIrO_3$, (La, Sr)$CoO_3$, Cu, Al, Ta, Mo, W, Au, Ag, $WSi_2$, $TiSi_2$, $MoSi_x$(x=0.3~2), $CoSi_x$ (x=1~2), $NbSi_x$(x=0.3~2), $TaSi_x$(x=1~2), TiN, TaN, WN, TiSiN, TiAlN, TiBN, ZrSiN, ZrAlN, MoSiN, MoAlN, RuTiN, IrTiN, TaSiN, TaAlN and their mixtures.

The dielectric layer 59 is made of a ferroelectrics layer or a layer having a high dielectric constant, which includes $Ta_2O_5$, STO($SrTiO_3$), BST, PZT, PLZT((Pb, La)(Zr, Ti)$O_3$), BTO($BaTiO_3$), PMN(Pb($Ng_{1/3}Nb_{2/3}$)$O_3$), SBTN((Sr, Bi)(Ta, Nb)$_2O_9$), SBT((Sr, Bi)$Ta_2O_9$), BLT((Bi, La)$Ti_3O_{12}$) or PT($PbTiO_3$).

Referring to FIGS. 6A to 6E, there are provided cross-sectional views showing process steps of a method for fabricating the semiconductor device in accordance with the second embodiment of the present invention.

Figure 6A:
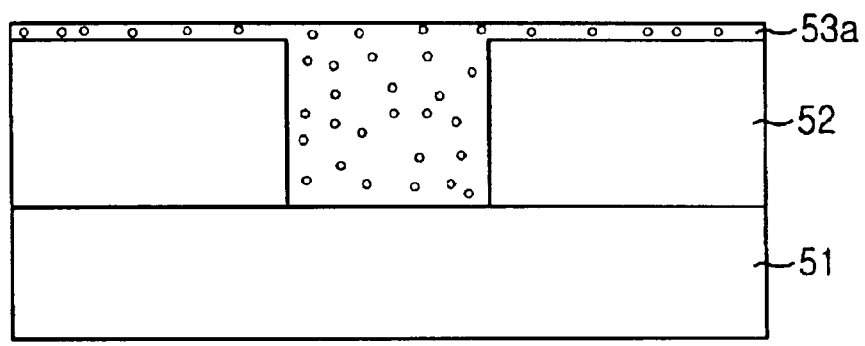
FIGS. 6A to 6E are cross-sectional views showing process steps utilized in the method for fabricating the semiconductor device in accordance with a second embodiment of the present invention.

As shown in FIG. 6A, the interlayer insulating layer 52 is deposited and planarized on the semiconductor substrate 51 on which a bit line contact, a bit line and a transistor consisting of a word line, a source and a drain are formed.

Next, after forming a contact hole exposing a certain surface of the semiconductor substrate 51 (the source or drain electrodes) by selectively etching the interlayer insulating layer 52, poly-Si 53a is deposited on the interlayer insulating layer 52 in which the contact hole is formed. The poly-Si 53a is deposited by using one of the CVD, the PVD or the ALD methods.

The poly-Si 53a is recessed to remain on the interlayer insulating layer 52 outside the contact hole in a thickness of 10 Å to 1000 Å.

Figure 6B:
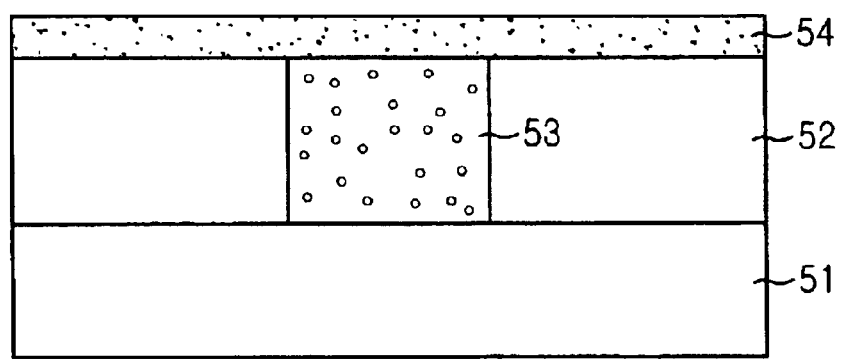

In FIG. 6B, the $IrSi_x$ layer 54 is formed by a silicide reaction of iridium and silicon atoms of the poly-Si 53a by depositing iridium on the poly-Si 53a in a high temperature in-situ environment.

At this time, since the poly-Si outside the contact hole is all consumed when forming the iridium-silicide layer 54, poly-Si does not remain on the interlayer insulating layer 52 and the poly-Si disposed inside the contact hole acts as a plug 53 (hereinafter, referred to as "poly-Si plug").

In the case of using the $SiO_2$ series interlayer insulating layer 52, and the diffusion barrier layer 57 and the bottom electrode 58 containing iridium, the iridium-silicide layer 54 acts as a glue layer suppressing the lifting phenomenon of the bottom electrode 58, since it contains silicon and iridium.

The iridium-silicide layer 54 is formed by depositing iridium at a temperature of 500° C. to 800° C. by an in-situ process and, then, performing at least one thermal treatment at a temperature of 500° C. to 800° C.

When forming the iridium-silicide layer 54, a composition ratio of iridium to silicon is determined according to the temperature and environment of the thermal treatment, and the electrical conductivity varies depending on the composition ratio.

Figure 6C:
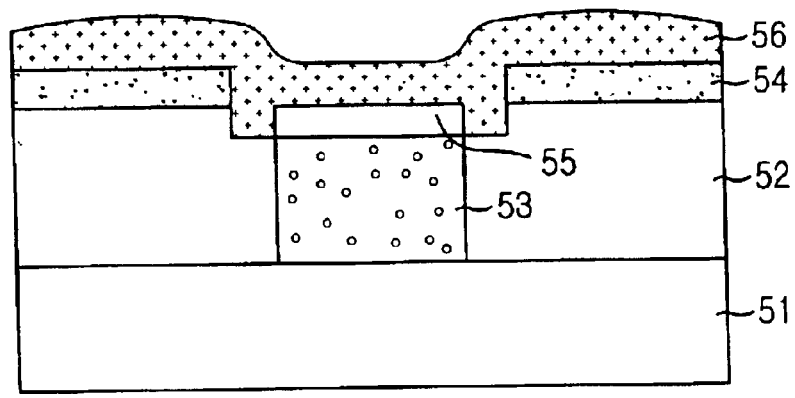

As illustrated in FIG. 6C, there is formed a contact hole for connecting the poly-Si plug 53 with the bottom electrode 58 to be formed later by selectively etching the iridium-silicide layer 54. The width of the contact hole is larger than the corresponding contact hole in the first embodiment of the present invention, as shown in FIG. 4C. Therefore, when etching the iridium-silicide layer 54 to make the contact hole, parts of the poly-Si plug 53 and the interlayer insulating layer 52 can be etched as shown in the drawing.

Subsequently, the Ti-silicide layer 55 is formed on the poly-Si plug 53 by the reaction of Ti and the silicon atoms of the poly-Si plug 53 whereby Ti is deposited on the surface of the intermediate product and the RTP is applied to the deposited Ti.

Herein, the Ti-silicide layer 55 forms an ohmic contact between the poly-Si plug 53 and the bottom electrode 58.

Next, after removing unreacted Ti, TiN 56 is deposited on the surface of the intermediate product.

Figure 6D:
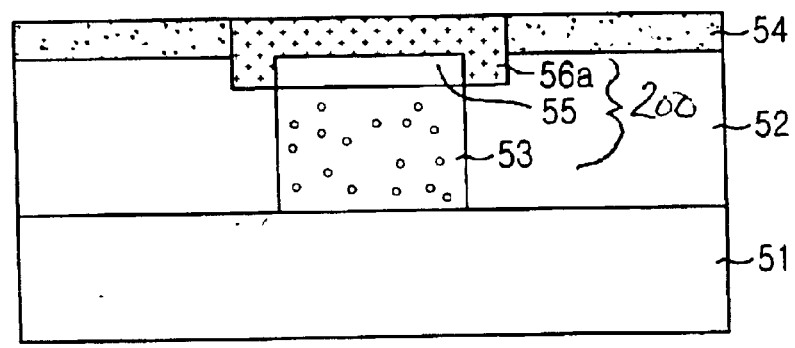

In FIG. 6D, the TiN layer 56a is formed by conducting the CMP process for TiN 56 until the surface of the glue layer 54 is exposed. The TiN layer 56a which entirely fills up the contact hole has a planarized structure.

At this time, it is possible to minimize the loss of the glue layer 54 in the CMP process by adjusting the amount of slurry so as to maintain a polishing ratio of the TiN 56 to the glue layer 54 of 50~80:1.

It is preferable that the barrier layer, such as the TiN layer 56a, has a thickness of 50 Å to 5000 Å to reduce the contact resistance and to enhance its diffusion barrier property, and its oxidation barrier property can be improved by further executing a plasma process using $N_2$, $N_2O$, $NH_3$ or $O_2$.

Figure 6E:
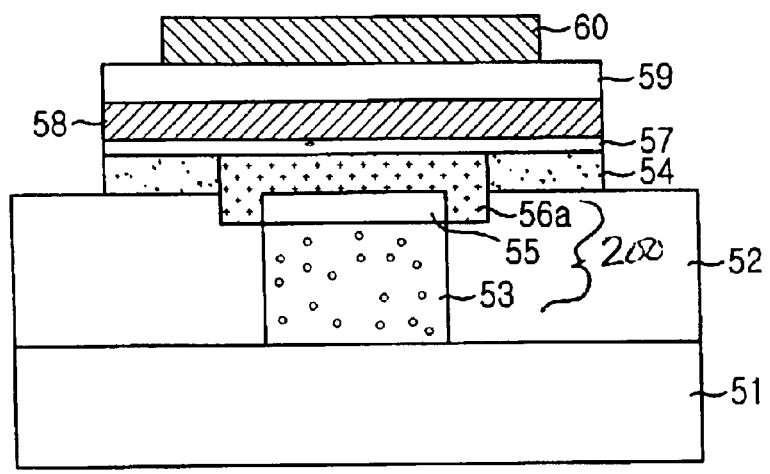

As shown in FIG. 6E, after forming the diffusion barrier layer 57 on the TiN layer 56a and the glue layer 54, there are sequentially formed on the diffusion barrier layer 57, the bottom electrode 58, the dielectric layer 59 and the top electrode 60.

The dielectric layer 59 is deposited through the use of one of the MOD, the Sol-gel, the spin-on, the CVD, the ALD and the PVD methods. The diffusion barrier layer 57, the bottom electrode 58 and the top electrode 60 are deposited by one of the MOD, the CVD, the ALD and the PVD methods.

Next, the capacitor is made by patterning the top electrode 60 and then sequentially patterning the dielectric layer 59, the bottom electrode 58, the diffusion barrier layer 57 and the glue layer 54, wherein the width of the bottom electrode 58 is provided to be wider than that of the top electrode 60.

After patterning the dielectric layer 59, at least one thermal treatment is performed at 300° C. to 850° C. for the intermediate product. And, after forming the capacitor, a plasma process is conducted for the resulting product in a gas atmosphere containing $N_2$, e.g., $NH_3$, for improving the properties of the capacitor.

For instance, after solving the oxygen deficiency in the layers by performing an UV-$O_3$ thermal treatment or the plasma thermal treatment at a low temperature of 300° C. to 500° C., the RTP or furnace annealing is performed at a temperature of 500° C. to 850° C. to remove impurities such as carbon, hydrogen, etc. remaining in the layers and obtain a dielectric property.

In accordance with the first and the second embodiments described above, the non-planarized topology is suppressed by polishing the barrier layer so as to be planarized with the surface of the glue layer after forming the contact hole in the glue layer for the connection between the barrier layer and the bottom electrode.

Referring to FIGS. 7A to 7E, there are provided cross-sectional views showing process steps of a method for fabricating a semiconductor device in accordance with a third embodiment of the present invention.

Figure 7A:
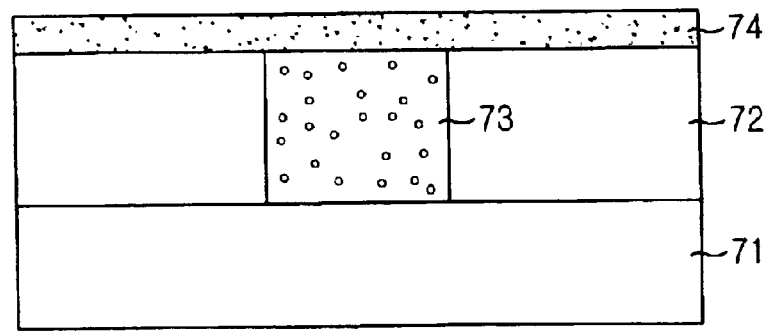
FIGS. 7A to 7E are cross-sectional views showing process steps utilized in the method for fabricating a semiconductor device in accordance with a third embodiment of the present invention.

As shown in FIG. 7A, an interlayer insulating layer 72 is deposited and planarized on a semiconductor substrate 71 on which a bit line contact, and a bit line and a transistor including a word line, a source and a drain are formed.

The interlayer insulating layer 72 employs one member selected from the group consisting of BSG, BPSG, HDP oxide layer, USG, TEOS, APL oxide layer, SOG and their combination.

Next, after forming a contact hole exposing a certain surface of the semiconductor substrate 71 (source or drain electrode) by selectively etching the interlayer insulating layer 72, poly-Si is deposited on the interlayer insulating layer 72 in which the contact hole is formed.

The deposited poly-Si is recessed to form a poly-Si plug 73, which fills up the contact hole and acts as a connector for electrically connecting the semiconductor substrate 71 and a bottom electrode to be formed later.

The conductive layer for the plug 73 acting as the connector is made of one member selected from the group consisting of poly-Si, W, W-silicide, TiN, TiAlN, TaSiN, TiSiN, TaN, TaAlN, TiSi, TaSi and combinations thereof.

The conductive layer for the plug 73 is deposited by using one of the CVD, the PVD and the ALD methods.

Next, as a glue layer between the interlayer insulating layer 72 and the bottom electrode, an iridium oxide ($IrO_2$) layer 74 is deposited on the interlayer insulating layer 72 whose contact hole is filled with the poly-Si plug 73.

The $IrO_2$ layer 74 acts as the glue layer to avoid an adhesive defect due to the oxidation of the bottom electrode at the boundary surface between the bottom electrode and the interlayer insulating layer 72 and the lifting phenomenon occurring between the layers, which is caused by the adhesive defect.

The glue layer 74 is made of at least one member selected from the group consisting of $IrO_2$, $IrSi_x$(x=1~2), $Al_2O_3$, $Ta_2O_5$, $TiO_x$(x=1~2), $ZrO_x$(x=1~2) and $HfO_x$(x=1~2), and deposited with a thickness of 50 Å to 5000 Å through the use of one of the CVD, the PVD and the ALD methods.

To improve the adhesive property with the interlayer insulating layer 72 after forming the glue layer 74, a separate thermal treatment or plasma treatment can be performed and the thermal treatment is conducted by using a diffusion furnace or the RTP.

The thermal treatment is performed at a temperature of 200° C. to 800° C. in a gas atmosphere of He, Ne, Ar, Xe, $N_2$ or $O_2$ and the plasma treatment is executed in a gas atmosphere of $O_2$, $O_3$, $N_2$, $N_2O$, $NH_3$ or combinations thereof.

Figure 7B:
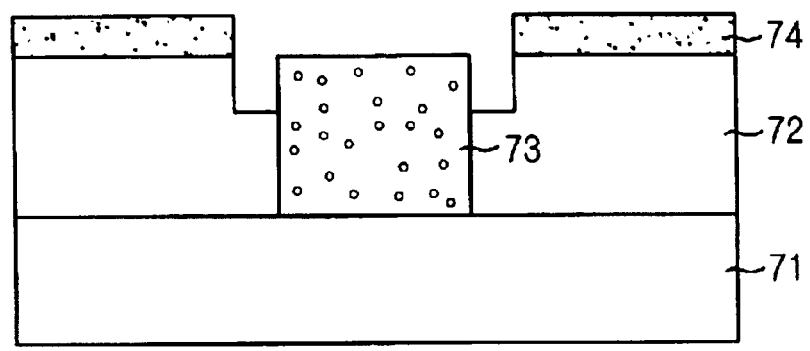

As shown in FIG. 7B, the contact hole electrically connecting the poly-Si plug 73 and the bottom electrode is made by etching the $IrO_2$ layer 74 by using a patternized photo-resist film as a mask (not shown).

At this time, a part of the interlayer insulating layer 72 is etched by the over-etching required for etching the $IrO_2$ layer 74, so that an upper portion of the poly-Si plug 73 is extruded.

Figure 7C:
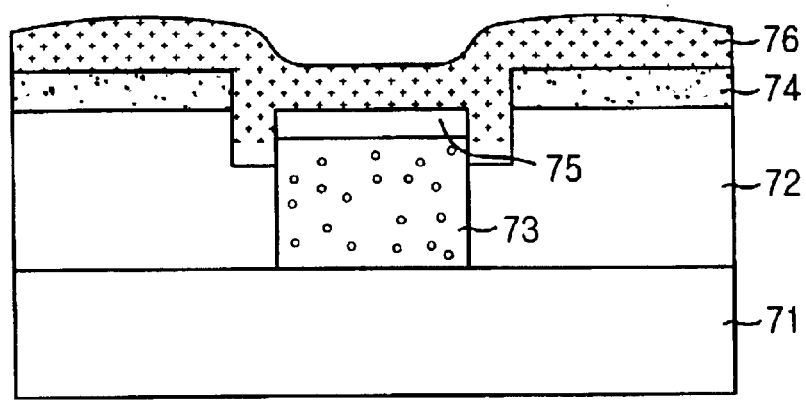

In FIG. 7C, a Ti-silicide layer 75 is formed on the poly-Si plug 73 by the reaction of Ti and silicon atoms in the poly-Si plug 73 caused by depositing Ti on the surface of the intermediate product and performing the RTP.

Herein, the Ti-silicide layer 75 is an ohmic contact layer constructing an ohmic contact between the poly-Si plug 73 and the bottom electrode. The ohmic contact layer is made of $CoSi_2$ or $MoSi_2$ as well as the Ti-silicide.

Next, after removing unreacted Ti, TiN 76 is deposited on the surface of the intermediate product.

Figure 7D:
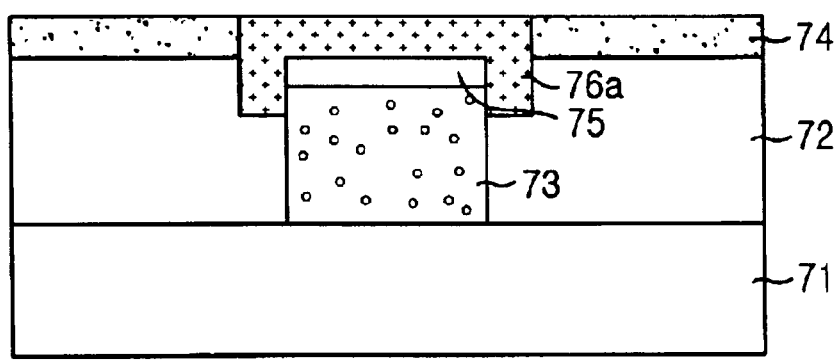

In FIG. 7D, a TiN layer 76a is formed by performing the CMP process for the TiN 76 until the surface of the glue layer 74 is exposed, wherein the TiN layer 76a has a planarized structure of entirely filling up the contact hole.

At this time, it is possible to minimize the loss of the glue layer 74 in the CMP process by appropriately adjusting the amount of slurry so as to maintain the polishing ratio of the TiN 76 to the glue layer 74 of 50~80:1.

The TiN layer 76a is a barrier layer for precluding the inter-diffusion between the poly-Si plug 73 and the bottom electrode and is made of one member selected from TiN, TaN, TiSiN, TiAlN, RuTiN and RuTiO.

It is preferable that the barrier layer such as the TiN layer 76a has a thickness of 50 Å to 5000 Å to reduce the contact resistance and to enhance its diffusion barrier property, and its oxidation barrier property can be improved by further executing a plasma process using $N_2$, $N_2O$, $NH_3$ or $O_2$.

Figure 7E:
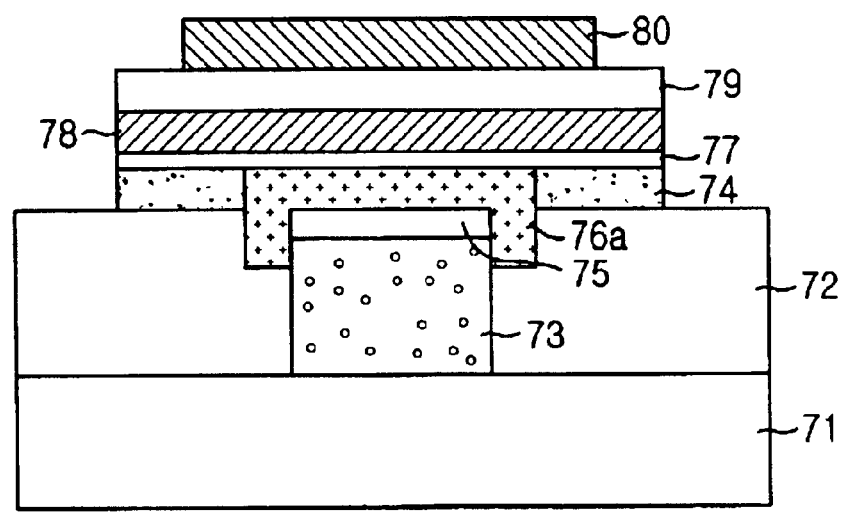

As shown in FIG. 7E, after forming a diffusion barrier layer 77 on the TiN layer 76a and the glue layer 74, there are sequentially formed the bottom electrode 78, a dielectric layer 79 and a top electrode 80 on the diffusion barrier layer 77.

The diffusion barrier layer 77 which suppresses oxide diffusion from the bottom electrode 78, the bottom electrode 78 and the top electrode 80 are formed by one member selected from the group consisting of Pt, Ir, $IrO_x$, Ru, $RuO_x$, Rh, $RhO_x$, Os, $OsO_x(x=1~2)$, Pd, $PdO_x(x=1~2)$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_2$, $TiSi_2$, $MoSi_x$ $(x=0.3~2)$, $CoSi_x(x=1~2)$, $NbSi_x(x=0.3~2)$, $TaSi_x(x=1~2)$, TiN, TaN, WN, TiSiN, TiAlN, TiBN, ZrSiN, ZrAlN, MoSiN, MoAlN, RuTiN, IrTiN, TaSiN, TaAlN and combinations thereof.

The dielectric layer 79 is made of a ferroelectric layer or a layer having a high dielectric constant, which includes $Ta_2O_5$, $STO(SrTiO_3)$, BST, PZT, $PLZT((Pb, La)(Zr, Ti)O_3)$, $BTO(BaTiO_3)$, $PMN(Pb(Ng_{1/3}Nb_{2/3})O_3)$, $SBTN((Sr, Bi)(Ta, Nb)_2O_9)$, $SBT((Sr, Bi)Ta_2O_9)$, $BLT((Bi, La)Ti_3O_{12})$ or $PT(PbTiO_3)$. This dielectric layer 79 is deposited by one of the MOD, the Sol-gel, the spin-on, the CVD, the ALD and the PVD methods.

Next, a capacitor is made by patterning the top electrode 80 and then sequentially patterning the dielectric layer 79, the bottom electrode 78, the diffusion barrier layer 77 and the glue layer 74, wherein the width of the bottom electrode 78 is provided to be wider than that of the top electrode 80.

After patterning the dielectric layer 79, at least one thermal treatment is performed at 300° C. to 850° C. for the intermediate product. And, after forming the capacitor, a plasma process is applied to the resulting product in a gas atmosphere containing $N_2$, e.g., $NH_3$, to improve the properties of the capacitor.

After sufficiently solving the oxygen deficiency in the layers by performing a UV-$O_3$ thermal treatment or the plasma thermal treatment at a low temperature of 300° C. to 500° C., the RTP or furnace annealing is performed at a temperature of 500° C. to 850° C. to remove impurities such as carbon, hydrogen, etc. remaining in the layers and obtain a dielectric property.

Figure 8A:
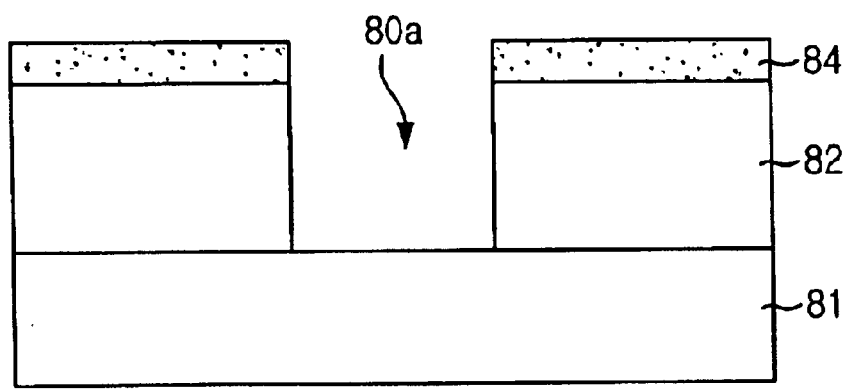
FIGS. 8A to 8C are cross-sectional views showing process steps utilized in the method for fabricating a semiconductor device in accordance with a fourth embodiment of the present invention.
Figure 8B:
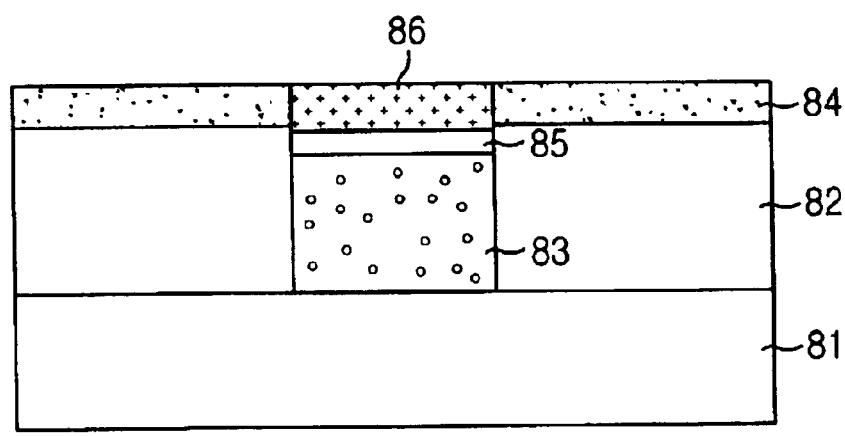
Figure 8C:
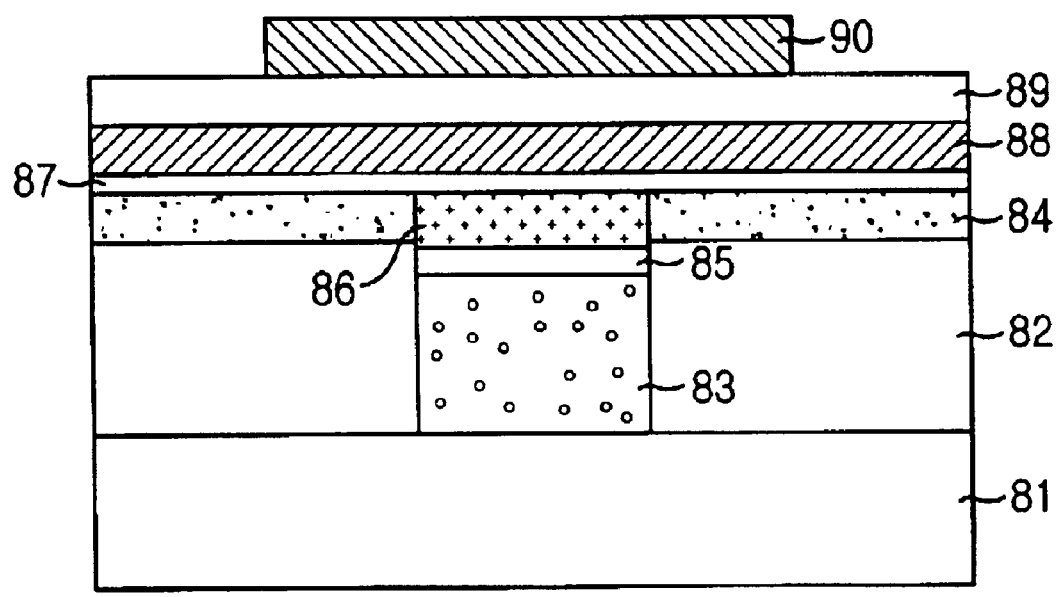

Referring to FIGS. 8A to 8C, there are shown cross-sectional views showing process steps of a method for fabricating a semiconductor device in accordance with a fourth embodiment of the present invention.

As illustrated in FIG. 8A, an interlayer insulating layer 82 is deposited and planarized on a semiconductor substrate 81 on which a bit line contact, a bit line and a transistor consisting of a word line, a source and a drain are formed.

Next, a glue layer 84 is formed to preclude the adhesive defect between the interlayer insulating layer 82 and a bottom electrode to be formed later, and the lifting phenomenon of layers caused by the adhesive defect.

The interlayer insulating layer 82 employs one member selected from the group consisting of BSG, BPSG, HDP oxide layer, USG, TEOS, APL oxide layer, SOG and combinations thereof. The glue layer 84 is formed with a thickness of 50 Å to 5000 Å by using $Al_2O_3$, $Ta_2O_5$, $TiO_x(x=1~2)$, $ZrO_x(x=1~2)$, $IrO_2$, $IrSi_x(x=1~2)$ or $HfO_x(x=1~2)$ which is deposited through the use of one of the CVD, the PVD and the ALD methods.

As described above, a separate thermal treatment or plasma treatment can be performed to improve the adhesive property of the glue layer 84 after forming the glue layer.

The thermal treatment is conducted at a temperature of 200° C. to 800° C. in a gas atmosphere of He, Ne, Ar, Xe, $N_2$ or $O_2$ by using a diffusion furnace or the RTP. In case of using the diffusion furnace, it is preferable that the thermal treatment is performed from 10 minutes to 2 hours. On the other hand, for the RTP, it is preferable that the thermal treatment is performed for 10 seconds to 10 minutes.

The plasma treatment is performed in a gas atmosphere of $O_2$, $O_3$, $N_2$, $N_2O$, $NH_3$, etc.

Next, a contact hole 80a is formed for exposing a certain surface of the semiconductor substrate 81, e.g., a part of the source or drain of the transistor (not shown), by selectively etching the glue layer 84 and the interlayer insulating layer 82. One mask is used to etch the glue layer 84 and the interlayer insulating layer 82 and, accordingly, a separate process of producing a glue layer opening mask can be omitted.

As a result, the manufacturing process can be simplified and, further, it is possible to originally prevent the loss of the underlying layers due to the etching process for opening the glue layer 84.

In FIG. 8B, a connection unit employing layers 83, 85 and 86 is made by filling the contact hole 80a and planarizing the surface of the filled-up contact hole with that of the glue layer 84. The connection unit has a multi-layer structure including a poly-Si layer 83 and a barrier metal layer. The barrier metal layer has an ohmic layer 85 for reducing the contact resistance and a diffusion barrier layer 86.

Specifically, after depositing poly-Si on the surface of the intermediate product including the contact hole 80a to thereby fully fill up the contact hole 80a, there is formed a poly-Si plug 83, which is recessed to the inside of the contact hole 80a. At this recessing process, it is preferable that the poly-Si and the glue layer 84 have a high etch selectivity of 50:1 and the recessed depth becomes 500 Å to 5000 Å. The poly-Si plug 83 employs poly-Si doped with P or As and is formed by using as a plug material one member selected from poly-Si, W, W-silicide, TiN, TiAlN, TaSiN, TiSiN, TaN, TaAlN, TiSi and TaSi. The plug material is deposited through the use of one of the CVD, the PVD and the ALD methods.

Subsequently, the Ti-silicide layer 85 is formed on the poly-Si plug 83 by depositing Ti on the surface of the intermediate product and then performing a thermal treatment to thereby induce a reaction between Ti and the Si in the poly-Si plug 83. The Ti-silicide layer 85 forms an ohmic contact between the poly-Si layer 83 and a bottom electrode to be formed later.

After forming the TiN layer 86 on the Ti-silicide layer 85, the barrier metal layer having a laminated structure of the Ti-silicide layer 85 and the TiN layer 86 is formed on the poly-Si plug 83 by performing the CMP or etching the whole surface of the TiN layer 86 so as to make the surface of the TiN layer 86 planarized with that of the glue layer 84.

In this processing step, it is possible to minimize the loss of the glue layer 84 in the CMP process by appropriately adjusting the amount of slurry to maintain the polishing ratio of the TiN layer 86 to the glue layer 84 at 80:1.

The ohmic layer 85 is made of $TiSi_2$, TiSi, CoSi or $CoSi_2$ and the diffusion barrier layer 86 is made of TiAlN, TiSiN, TaN, RuTiN or RuTiO besides TiN.

It is preferable that the barrier metal layer 85 and 86 is formed with a thickness of 50 Å to 5000 Å so as to reduce the contact resistance and to enhance its diffusion barrier property and its oxidation barrier property can be improved by further conducting a plasma process using $N_2$, $N_2O$, $NH_3$ or $O_2$.

In FIG. 8C, a capacitor is formed by sequentially depositing the bottom electrode, a dielectric layer 89 and a top electrode 90 on the connection unit 83, 85 and 86. The bottom electrode has a multi-layer structure including a diffusion barrier layer 87 formed on the connection unit 83, 85 and 86 and a metal layer 88 formed on the diffusion barrier layer 87.

Hereinafter, a process for fabricating the capacitor will be described in detail.

At first, after sequentially stacking the diffusion barrier layer 87 and the metal layer 88 by using the CVD, the PVD or the ALD method, there is performed a thermal treatment process, e.g., furnace annealing or the RTP, for the stacked layers.

The thermal treatment process is executed at a temperature of 200° C. to 800° C. in a gas atmosphere of $O_2$, $O_3$, $N_2$ or Ar. In case of performing the furnace annealing, it is preferable that the thermal treatment is conducted for 10 minutes to 5 hours. On the other hand, for the RTP, it is preferable that the thermal treatment is performed for one second to 10 minutes.

Meanwhile, a plasma treatment can keep pace with the thermal treatment and is performed in a gas atmosphere of $O_2$, $O_3$, $N_2$, $N_3O$ or $NH_3$.

In accordance with this embodiment, the bottom electrode is made of an Ir or $IrO_x$ layer 87 and a Pt layer 88. Except them, the bottom electrode can be formed by using one member selected from the group consisting of $PtO_x(x=1\sim2)$, Ru, $RuO_x(x=1\sim2)$, Rh, $RhO_x(x=1\sim2)$, Os, $OsO_x(x=1\sim2)$, Pd, $PdO_x(x=1\sim2)$, $CaRuO_3$, $SrRuO_3$, $BaRuO_3$, $BaSrRuO_3$, $CaIrO_3$, $SrIrO_3$, $BaIrO_3$, $(La, Sr)CoO_3$, Cu, Al, Ta, Mo, W, Au, Ag, $WSi_x(x=1\sim2)$, $TiSi_x(x=1\sim2)$, $MoSi_x(x=0.3\sim2)$, $CoSi_x(x=1\sim2)$, $NbSi_x(x=0.3\sim2)$, $TaSi_x(x=1\sim2)$, TiN, TaN, WN, TiSiN, TiAlN, TiBN, ZrSiN, ZrAlN, MoSiN, MoAlN, RuTiN, IrTiN, TaSiN, TaAlN and combinations thereof. It is preferable that the thickness of the bottom electrode is 50 Å to 5000 Å.

The dielectric layer 89 is formed on the bottom electrode by using a ferroelectrics layer or a layer having a high dielectric constant, which includes $Ta_2O_5$, $STO(SrTiO_3)$, BST, PZT, $PLZT((Pb, La)(Zr, Ti)O_3)$, $BTO(BaTiO_3)$, PMN $(Pb(Ng_{1/3}Nb_{2/3})O_3)$, $SBTN((Sr, Bi)(Ta, Nb)_2O_9)$, $SBT((Sr, Bi)Ta_2O_9)$, $BLT((Bi, La)Ti_3O_{12})$ or $PT(PbTiO_3)$. The dielectric layer 89 is deposited with a thickness of 20 Å to 5000 Å through the use of one of the MOD, the Sol-gel, the spin-on, the CVD, the ALD and the PVD methods.

In order to improve the electric permittivity of the dielectric layer 89, a crystallization thermal treatment is performed for the dielectric layer 89 at a temperature of 400° C. to 800° C. in a gas atmosphere of $O_2$, $N_2$, Ar, $O_3$, He, Ne or Kr.

For executing the crystallization thermal treatment, the diffusion furnace annealing or the RTP can be used and, in the case of the diffusion furnace annealing, it is preferable to perform the thermal treatment for 10 minutes to 5 hours.

Next, the top electrode 90 is formed on the dielectric layer 89 by using the same material and deposition method as used in forming the bottom electrode 87 and 88.

The capacitor can be formed by performing a patterning process including 3 etching steps: a first etching step for the top electrode 90; a second one for the dielectric layer 89; and a third one for the bottom electrode 87 and 88. In accordance with another embodiment, the capacitor can be generated by executing a patterning process including 2 etching steps: a first etching step for the top electrode 90; and a second etching step for the dielectric layer 89 and the bottom electrode 87 and 88. In accordance with still another embodiment, the capacitor can be formed through the use of a patterning process for patterning the top electrode 90, the dielectric layer 89 and the bottom electrode 87 and 88 at the same time.

In the above embodiments of the present invention, although there is shown the stack-type capacitor, the present invention is applicable to any semiconductor device employing a ferroelectrics layer or a layer having a high dielectric constant as a dielectric layer of the capacitor, or a barrier layer between the plug and the bottom electrode. Furthermore, since a portion on which the bottom electrode is formed is planarized, the present invention is also applicable to concave-type and cylinder-type capacitors.

Moreover, the present invention can be applied to forming a capacitor connected to a conductive layer such as a gate electrode of a transistor in addition to those connected to the source/drain electrodes of the transistor, and to a capacitor over bit line (CBO) structure in which a capacitor is formed on the bit line and a capacitor under bit line (CUB) structure in which a bit line is formed on the capacitor.

As described above, in accordance with the present invention, since the non-planarized topology is not generated, a practical contact area between the bottom electrode and the dielectric layer increases and, thus, it is easy to control the amount of charge flowing from the capacitor. As a result, it is possible to implement uniform and reliable semiconductor devices.

Further, since the diffusion barrier layer is uniformly formed, it is possible to prevent the plug and the barrier layer from being oxidized in a thermal treatment process for forming the dielectric layer and to obtain the effect of increasing the process margin for subsequent processes.

While the present invention has been described with respect to the particular embodiments, it will be apparent to those skilled in the art that various changes and modifications may be made without departing from the spirit and scope of the invention as defined in the following claims.

What is claimed is:

1. A semiconductor device comprising:
   a conductive layer;
   an insulating layer formed on the conductive layer;
   a glue layer formed on the insulating layer;
   a connection unit, which is in contact with the conductive layer through the glue layer and the insulating layer, wherein the connection unit includes a plug and a barrier layer stacked on the conductive layer and a surface of the barrier layer is planar with that of the glue layer; and
   a capacitor including a first electrode formed on the connection unit and the glue layer, a dielectric layer formed on the first electrode and a second electrode formed on the dielectric layer.

2. The semiconductor device as recited in claim 1, wherein the glue layer is made of at least one member selected from the group consisting of $IrO_2$, $IrSi_x$, $Al_2O_3$, $Ta_2O_5$, $TiO_y$, $ZrO_z$, and $HfO_p$, wherein,
   x is 1 to 2;
   y is 1 to 2;
   z is 1 to 2; and
   p is 1 to 2.

3. The semiconductor device as recited in claim 1, wherein the barrier layer is made of at least one member selected from the group consisting of TiN, TaN, TiSiN, TiAlN, RuTiN and RuTiO.

4. The semiconductor device as recited in claim 1, wherein the first electrode is a laminated layer including a diffusion barrier layer, and the first electrode and the second electrode are formed by one member selected from the group consisting of Pt, Ir, $IrO_h$, Ru, $RuO_i$, Rh, $RhO_j$, $CaRuO_3$, $SrRuO_3$, $BaRuO_3$, $BaSrRuO_3$, $CaIrO_3$, $SrIrO_3$, $BaIrO_3$, (La, Sr)$CoO_3$, Cu, Al, Ta, Mo, W, Au, Ag, $WSi_2$, $TiSi_2$, $MoSi_x$, $CoSi_y$, $NbSi_z$, $TaSi_p$, TiN, TaN, WN, TiSiN, TiAlN, TiBN, ZrSiN, ZrAlN, MoSiN, MoAlN, RuTiN, IrTiN, TaSiN, TaAlN, Os, $OsO_q$, Pd, $PdO_r$, and combinations, wherein,
   h, i and j are a positive number;
   x is 0.3 to 2;
   y is 1 to 2;
   z is 0.3 to 2;
   p is 1 to 2;
   q is 1 to 2; and
   r is 1 to 2.

5. A method for fabricating a semiconductor device, comprising the steps of:
   forming an insulating layer on a first conductive layer;
   forming a first connection layer contacted to the first conductive layer through the insulating layer;
   forming a glue layer on the insulating layer and the first connection layer;
   forming an opening exposing the first connection layer by removing a part of the glue layer;
   forming a second connection layer to fill up the opening;
   planarizing the second connection layer to have a planar surface with the glue layer; and
   forming a capacitor including a first electrode formed on the second connection layer and the glue layer, a dielectric layer and a second electrode.

6. The method according to claim 5, wherein the step of forming the second connection layer includes the steps of:
   forming a second conductive layer on the surface of the glue layer and the opening unit; and
   forming a barrier layer employing a part of the second conductive layer by performing a chemical mechanical polishing process for the second conductive layer until the surface of the glue layer is exposed.

7. The method according to claim 5, wherein the step of forming the first connection layer includes the steps of:
   forming a contact hole exposing a certain surface of the first conductive layer by selectively etching the insulating layer;
   forming a third conductive layer on the surface of the insulating layer and the contact hole; and
   forming a plug by etching back the third conductive layer.

8. The method according to claim 5, wherein the step of forming the glue layer is performed by using one of a chemical vapor deposition (CVD), a physical vapor deposition (PVD) and an atomic layer deposition (ALD) methods.

9. The method according to claim 5, wherein the glue layer is made of at least one member selected from the group consisting of $IrO_2$, $IrSi_x$, $Al_2O_3$, $Ta_2O_5$, $TiO_y$, $ZrO_z$, $HfO_p$, wherein,
   x is 1 to 2;
   y is 1 to 2;
   z is 1 to 2; and
   p is 1 to 2.

10. The method according to claim 5, wherein the second connection layer is made of one member selected from the group consisting of TiN, TaN, TiSiN, TiAlN, RuTiN, RuTiO and combinations thereof.

11. A method for fabricating a semiconductor device, comprising the steps of:
    forming an interlayer insulating layer on a semiconductor substrate where a transistor is formed;
    forming a contact hole exposing a certain part of the semiconductor substrate by selectively etching the interlayer insulating layer;
    forming a plug containing silicon, which remains on the interlayer insulating layer in a certain thickness and fills up the contact hole;
    forming a glue layer containing silicon and iridium on the plug and the interlayer insulating layer;
    forming an opening exposing the plug by selectively etching the glue layer;
    forming a barrier layer on the glue layer and the opening;
    planarizing the barrier layer until the surface of the glue layer is exposed; and
    forming a capacitor including a bottom electrode, a dielectric layer and a top electrode on the barrier layer and the glue layer.

12. The method of claim 11, wherein the step of forming the glue layer includes the steps of:
    depositing iridium on the plug and the interlayer insulating layer at a temperature of about 500° C. to about 800° C. by an in-situ process; and
    performing at least one thermal treatment for the deposited iridium at a temperature of about 500° C. to about 800° C.

13. The method of claim 11, wherein the step of forming the plug includes the steps of:
    depositing poly-Si on the interlayer insulating layer in which the contact hole is formed; and
    etching back the poly-Si to fill up the contact hole while retaining the poly-Si on the interlayer insulating layer at a predetermined thickness.

14. The method of claim 13, wherein the poly-Si remains on the interlayer insulating layer with a thickness of about 10 Å to about 1000 Å.

15. The method of claim 11, wherein the step of planarizing the barrier layer is performed by a chemical mechanical polishing process with a polishing ratio of the barrier layer to the glue layer of about 50 to about 80:1.

16. The method of claim 11, wherein, in the step of forming the capacitor, the bottom electrode has a laminated structure including a diffusion barrier layer, and the bottom electrode and the top electrode are formed by one member selected from the group consisting of TiN, RuTiN, IrTiN, Ir, $IrO_x$, Ru, $RuO_y$, Rh, $RhO_z$, Pt and combinations thereof, wherein, x, y and z are positive numbers.

17. A method for fabricating a semiconductor device, comprising the steps of:
    stacking an insulating layer and a glue layer on a conductive layer;
    forming a contact hole exposing a certain surface of the conductive layer by selectively etching the glue layer and the insulating layer;
    forming a connection unit filling up the inside of the contact hole, wherein the connection unit has a multi-layer structure including a poly-Si layer and a barrier metal layer, and the step of forming the connection unit includes the steps of:
        forming the poly-Si layer partially filling up the contact hole;
        depositing a barrier layer metal on the poly-Si layer and the glue layer; and
        polishing the barrier metal until the surface of the glue layer is exposed to thereby form the barrier layer; and
    forming a capacitor on the connection unit.

18. The method as recited in claim 17, wherein one mask is used to etch the glue layer and the insulating layer.

19. The method as recited in claim 17, wherein the step of forming the poly-Si layer has the steps of:
    depositing poly-Si on the glue layer and the contact hole; and
    etching back the deposited poly silicon to thereby form the poly-Si layer.

20. The method as recited in claim 17, wherein the glue layer is made of one member selected from a group consisting of $Al_2O_3$, $Ta_2O_5$, $TiO_x$, $ZrO_y$, $IrO_2$, $IrSi_z$, and $HfO_p$, wherein, x is 1 to 2;
y is 1 to 2;
z is 1 to 2; and
p is 1 to 2.

21. The method as recited in claim 17, wherein the glue layer has a thickness of about 50 Å to about 5000 Å.

22. The method as recited in claim 17, wherein the capacitor includes a first electrode having a multi-layer structure of a diffusion barrier layer formed on the glue layer and the connection unit and a metal layer formed on the diffusion barrier layer, a dielectric layer formed on the first electrode and a second electrode formed on the dielectric layer.

23. The method as recited in claim 22, wherein the metal layer is made of one member selected from the group consisting of Ir, $IrO_p$, Pt, $PtO_q$, Ru, $RuO_r$, Rh, $RhO_s$, Os, $OsO_t$, Pd, $PdO_u$, $CaRuO_3$, $SrRuO_3$, $BaRuO_3$, $BaSrRuO_3$, $CaIrO_3$, $SrIrO_3$, $BaIrO_3$, (La, Sr)$CoO_3$, Cu, Al, Ta, Mo, W, Au, Ag, $WSi_v$, $TiSi_w$, $MoSi_x$, $CoSi_y$, $NbSi_z$, $TaSi_k$, TiN, TaN, WN, TiSiN, TiAlN, TiBN, ZrSiN, ZrAlN, MoSiN, MoAlN, TaSiN, TaAlN, RuTiN, ZrTiN and combinations thereof, wherein p is 1 to 2;
q is 0 to 1;
r is 1 to 2;
s is 1 to 2;
t is 1 to 2;
u is 1 to 2;
v is 1 to 2;
w is 1 to 2;
x is 0.3 to 2;
y is 1 to 2;
z is 1 to 2; and
k is 1 to 2.

24. The method as recited in claim 23, wherein the dielectric layer employs ferroelectric or material having a high dielectric constant.

* * * * *